(12) United States Patent
Wang et al.

(10) Patent No.: US 9,101,954 B2
(45) Date of Patent: Aug. 11, 2015

(54) GEOMETRIES AND PATTERNS FOR SURFACE TEXTURING TO INCREASE DEPOSITION RETENTION

(71) Applicant: Applied Materials, Inc., Santa Clara, CA (US)

(72) Inventors: Jianqi Wang, Fremont, CA (US); William Ming-ye Lu, Sunnyvale, CA (US); Yukari Nishimura, Sunnyvale, CA (US); Joseph F. Sommers, San Jose, CA (US); Sio On Lo, Milpitas, CA (US); Rajan Balesan, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/029,108

(22) Filed: Sep. 17, 2013

(65) Prior Publication Data
US 2015/0079336 A1    Mar. 19, 2015

(51) Int. Cl.
*G03F 7/00* (2006.01)
*B05C 21/00* (2006.01)

(52) U.S. Cl.
CPC .................... *B05C 21/005* (2013.01)

(58) Field of Classification Search
USPC .............. 428/73, 72; 430/312, 322; 206/586; 217/18
See application file for complete search history.

(56) References Cited

U.S. PATENT DOCUMENTS

| | | | | |
|---|---|---|---|---|
| 3,451,577 A | * | 6/1969 | Nurick | 217/26.5 |
| 3,482,082 A | | 12/1969 | Isreeli | |
| 4,355,731 A | * | 10/1982 | Carroll et al. | 217/26.5 |
| 4,913,784 A | | 4/1990 | Bogenschutz et al. | |
| 5,064,511 A | | 11/1991 | Gobbetti | |
| 5,228,245 A | | 7/1993 | Rice et al. | |
| 5,391,275 A | | 2/1995 | Mintz | |
| 5,401,319 A | | 3/1995 | Banholzer et al. | |
| 5,460,694 A | | 10/1995 | Schapira et al. | |
| 5,474,649 A | | 12/1995 | Kava et al. | |
| 5,628,839 A | * | 5/1997 | Saso et al. | 148/252 |
| 5,695,825 A | | 12/1997 | Scruggs | |
| 5,733,383 A | * | 3/1998 | Fazan et al. | 148/33.3 |
| 5,755,887 A | * | 5/1998 | Sano et al. | 118/715 |
| 5,817,568 A | * | 10/1998 | Chao | 438/427 |
| 5,910,338 A | | 6/1999 | Donde | |
| 5,916,454 A | | 6/1999 | Richardson et al. | |
| 5,966,614 A | * | 10/1999 | Park et al. | 438/401 |

(Continued)

FOREIGN PATENT DOCUMENTS

KR    10-2013-0036620    4/2013

OTHER PUBLICATIONS

PCT international search report and written opinion of PCT/US2012/032839 dated Oct. 31, 2012.

(Continued)

*Primary Examiner* — Cathy Lam
(74) *Attorney, Agent, or Firm* — Patterson & Sheridan, LLP

(57) ABSTRACT

A processing chamber component and method for fabricating the same are provided. The processing chamber component is fabricated in the manner described herein and includes the creation of at least a macro texture on a surface of the chamber component. The macro texture is defined by a plurality of engineered features arranged in a predefined orientation on the surface of the chamber component. In some embodiments, the engineered features prevent formation of a line of sight surface defined between the features to enhance retention of films deposited on the chamber component.

17 Claims, 8 Drawing Sheets

(56) References Cited

U.S. PATENT DOCUMENTS

| | | | |
|---|---|---|---|
| 5,976,948 A * | 11/1999 | Werner et al. | 438/424 |
| 6,057,208 A * | 5/2000 | Lin et al. | 438/424 |
| 6,090,683 A * | 7/2000 | Torek | 438/424 |
| 6,150,762 A | 11/2000 | Kim et al. | |
| 6,190,999 B1 * | 2/2001 | Hung et al. | 438/424 |
| 6,227,435 B1 | 5/2001 | Lazarz et al. | |
| 6,250,251 B1 | 6/2001 | Akiyama et al. | |
| 6,306,226 B1 | 10/2001 | Iino et al. | |
| 6,419,089 B1 * | 7/2002 | Dall | 206/521.1 |
| 6,423,175 B1 | 7/2002 | Huang et al. | |
| 6,506,312 B1 | 1/2003 | Bottomfield | |
| 6,558,505 B2 | 5/2003 | Suzuki et al. | |
| 6,569,747 B1 * | 5/2003 | Achuthan et al. | 438/424 |
| 6,613,646 B1 * | 9/2003 | Sahota et al. | 438/424 |
| 6,623,595 B1 | 9/2003 | Han et al. | |
| 6,623,597 B1 | 9/2003 | Han et al. | |
| 6,787,049 B2 * | 9/2004 | Tom et al. | 216/27 |
| 7,618,769 B2 | 11/2009 | Brueckner et al. | |
| 8,142,989 B2 * | 3/2012 | Brueckner et al. | 430/331 |
| 2002/0086118 A1 | 7/2002 | Chang et al. | |
| 2003/0047464 A1 | 3/2003 | Sun et al. | |
| 2003/0173526 A1 | 9/2003 | Popiolkowski et al. | |
| 2003/0188685 A1 | 10/2003 | Wang et al. | |
| 2004/0056211 A1 | 3/2004 | Popiolkowski et al. | |
| 2004/0180158 A1 | 9/2004 | Lin et al. | |
| 2005/0284372 A1 | 12/2005 | Murugesh et al. | |
| 2008/0261074 A1 | 10/2008 | Shishikura | |
| 2010/0059366 A1 | 3/2010 | Brueckner et al. | |
| 2012/0258280 A1 | 10/2012 | Jackson et al. | |

OTHER PUBLICATIONS

International Search Report and Written Opinion for International Application No. PCT/US2014/052727 (APPM/020761PCT) dated Dec. 11, 2014.

* cited by examiner

US 9,101,954 B2

GEOMETRIES AND PATTERNS FOR SURFACE TEXTURING TO INCREASE DEPOSITION RETENTION

BACKGROUND OF THE INVENTION

1. Field of the Invention

Embodiments described herein generally relate to processing chamber components and methods for fabricating the same. More specifically, embodiments described herein relate to geometries and patterns for surface texturing to increase deposition retention.

2. Description of the Related Art

Semiconductor process chamber components often have films deposited thereon as a result of processes performed in the chambers. The films deposited on the components may eventually peel or flake off and possibly shed particles onto a substrate being processed. The particles may cause defects in the integrated circuits being formed on the substrate.

Processing chamber components have been roughened to enhance the retention of deposited films, thereby extending the time at which the chamber component must be cleaned to preventing the films from flaking off the chamber component and becoming sources of contamination. Common examples of roughening processes include grit blasting and applying a twin wire arc spray coating. However, as surfaces have been roughened to greater and greater surface roughness ($R_A$) with the intention of retaining films for even longer intervals, coatings on peaks of the roughened surfaces have an increasing propensity to break off, thus becoming a frequent source of contamination themselves and making many highly roughened surfaces unsuitable for critical applications.

Still further, processing limitations for roughening a surface of a chamber component have proved to be a source of further difficulties. For example, if high heat is necessary to perform an surface roughening process, the high heat may cause the component to be distorted, such as by causing a plastic deformation, or cause fusion micro-cracks which reduce the integrity of the component. In addition, traditional processes for surface texturing may be expensive and time consuming. Finally, various surface textures still suffer from a lack of film retention which leads to particle creation within the processing chamber.

Thus, there is a need in the art for an improved processing chamber component and method of producing the same.

SUMMARY OF THE INVENTION

A processing chamber component and method for fabricating the same are provided. The processing chamber component is fabricated in the manner described herein and includes the creation of at least a macro texture on a surface of the chamber component. The macro texture is defined by a plurality of engineered features arranged in a predefined orientation on the surface of the chamber component. In some embodiments, the engineered features have a concave shaped surface to enhance retention of films deposited on the chamber component.

In one embodiment, an article having a surface patterned to enhance retention of deposited films is provided. The article may comprise a processing chamber component having a macro textured surface formed from engineered features arranged to prevent formation of a line of sight surface across the macro textured surface. The one or more of the engineered features has a concave surface.

In another embodiment, an article having a surface patterned to enhance retention of deposited films is provided. The article may comprise a processing chamber component having a macro textured surface formed from engineered features arranged in a predefined pattern that prevents formation of a line of sight surface across the textured surface. The engineered features may be arranged in a predefined pattern and the engineered features may have surfaces having a substantially concave shape.

In yet another embodiment, a method for fabricating a semiconductor chamber component is provided. The method may comprise covering a surface of a chamber component with a mask. Material may be removed from the surface of the chamber component to form a plurality of engineered features defining a textured surface. The engineered features may be arranged to prevent formation of a line of sight surface across the textured surface and the engineered features may comprise surfaces having a substantially concave shape.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

Figure 3:
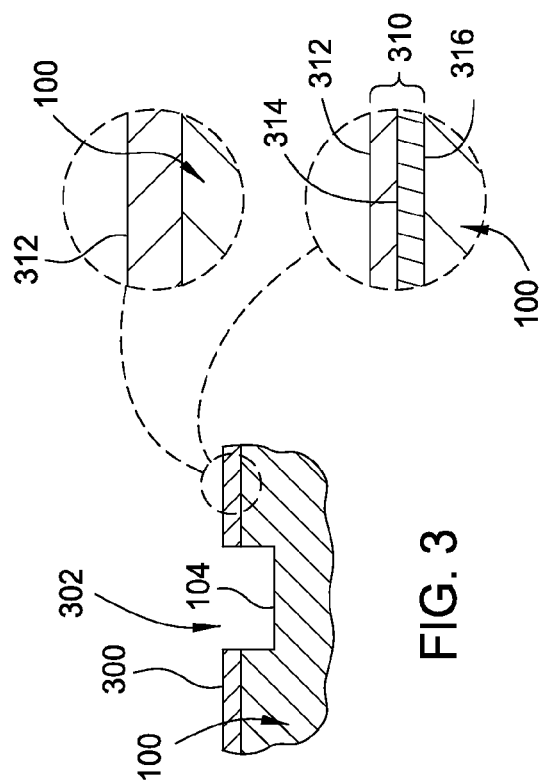
FIG. 3 is partial sectional view of the textured surface of the processing chamber component of FIG. 2 having a resist mask disposed thereon.

To facilitate understanding, identical reference numerals have been used, where possible, to designate identical elements that are common to the figures. It is also contemplated that elements and features of one embodiment may be beneficially incorporated on other embodiments without further recitation.

DETAILED DESCRIPTION

Embodiments described herein relate to methods to extend the kit life in a processing chamber and processing chamber components fabricated by the same. The processing chamber components fabricated in the manner described herein include the creation of at least a macro texture on a surface of the chamber component which has enhanced film retention, thereby extending the service interval and additionally reducing particle contamination. Thus, the novel processing chamber components contribute to reduced tool downtime and lower cost of ownership. It is contemplated that a "processing chamber component" includes components utilized in processing chambers used for the fabrication of integrated circuits, flat panel displays, solar panels, OLED's, LED's, and the like. It is also contemplated that the texturizing techniques described herein may find utility in other applications in which retention of a film to a surface is desired.

Embodiments described herein involve the deliberate creation of a macro texture on a process kit surface (e.g., surface of a chamber component) using a lithographic methodology in conjunction with a chemical etching process. The macro texture may be designed using knowledge of the film properties to maximize the percentage of the film retained. In the example of a compressive metal film, a recessed texture may be used to retain the film even in the event that the film fractures. This methodology allows the creation of a pattern on a process kit part that is tuned for the properties of the specific film, as well as pattern parts which cannot take the thermal load of alternative thermal patterning techniques. The method for texturizing the processing chamber component also avoids the challenges associated with making high-roughness coatings production-worthy. In some instances, defect counts have been substantially reduced and film stress has been reduced resulting in an increase in film adhesion, as well as substantially extending kit life. The process described herein may be used on all defect-sensitive parts of a process chamber. It is particularly useful on processes that do not have in-situ clean capabilities (e.g. PVD chambers and some metal CVD chambers).

Figure 1:
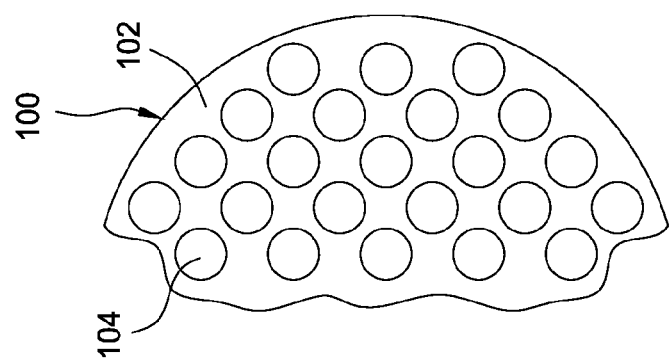
FIG. 1 is partial plan view of a textured surface of a processing chamber component of one embodiment.

FIG. 1 is partial plan view of a macro textured surface 102 of a processing chamber component 100 according to certain embodiments. The macro textured surface 102 includes a repetitive predefined pattern of engineered features 104. The term "engineered features" means that the general shape and arrangement of the features are transferred to the surface of the chamber component utilizing a mask or other precision machining technique that predefines where material is removed from the surface of the chamber component such that a predefined pattern of apertures is formed, for example, by utilizing the shape and arrangement of apertures formed through the mask to define the arrangement of the features 104. For example, surface etching or bead blasting without the use of a mask cannot form an engineered feature. The features 104 are at least partially recessed below the pre-textured surface of the chamber component 100, e.g., the top of the features 104 may be substantially coplanar with the pre-textured surface of the chamber component 100.

The features 104 may be contiguously connected, or may be discrete forms. For example, the features 104 may be contiguously connected recesses formed by removing material from the pre-textured surface of the chamber component 100 to leave "pillars" of material, as shown in the embodiments depicted in FIGS. 2 and 11; the features 104 may be discrete recesses in the form of a plurality of interconnected walls or ridges separating recessed areas formed in the pre-textured surface of the chamber component 100, as shown in the exemplary embodiments depicted in FIGS. 5 and 9; or a combination of contiguously connected and discrete features. The features 104 formed in the surface 102 may be arranged in a repetitive pattern or in a random manner. For example, the features 104 may be arranged to avoid creation of an uninterrupted planar surface between the features 104, for example, by arranging the features 104 in pattern or other arrangement that prevents a line of sight surface from being formed between the features 104 across the textured surface 102.

Examples of features 104 arranged in a pattern that has no line of sight surface defined between the features 104 across the textured surface 102 is depicted and described below with reference to FIGS. 9 and 11. Beneficially, a processing chamber component 100 having a textured surface 102 with no line of sight surfaces defined between the features 104 forming the textured surface 102 eliminates long uninterrupted linear surfaces which are susceptible to peeling of deposited material and/or easily shed particles. Thus, the processing chamber component 100, having a textured surface 102 with no line of sight surfaces defined between the features 104, may allow for longer service intervals between cleaning with a diminished risk of deposited film flaking. As a result, product yields may be improved, maintenance requirements may be reduced, and more profitable operation of processing chambers in which the texturized processing chamber component 100 is utilized may be realized.

The ease in which the features 104 may be applied to the processing chamber component 100 allows a macro textured surface 102 to be formed where traditional texturing would not be possible or could potentially damage the chamber component 100. For example, the features 104 and macro textured surface 102 can be formed on processing chamber components 100 fabricated from stainless steel, aluminum, ceramic, or other patternable materials.

As discussed above, the features 104 may have any number of geometric shapes, and the shapes need not be uniform across the textured surface 102. Although the features 104 are shown in plan view as circles (i.e., cylinders), the features 104 may have a groove, a polygonal or irregular shape, dimples, and other similar features. Alternatively, the spacing between the features 104 may have a uniform or irregular shape, size, and distribution across the textured surface 102.

Figure 2:
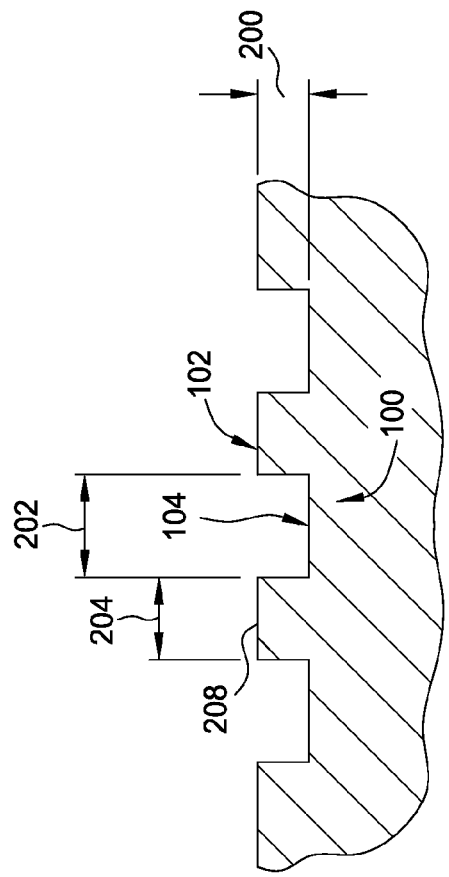
FIG. 2 is partial sectional view of the textured surface of the processing chamber component of FIG. 1.

FIG. 2 is partial sectional view of the textured surface 102 of the processing chamber component 100 of FIG. 1. The features 104 are illustrated as formed into the textured surface 102 to a depth 200, having a width or mean diameter 202, and an average spacing 204. The features 104 are considered a macro texture, as the textured surface 102 may be micro textured after feature formation, as further discussed below. The depth 200 may be in the range of 100 µm to about 200 µm, and may even be as much as about 1 mm deep. The width or mean diameter 202 may be between about 100 µm to about 200 µm, and may even be as much as about 1 mil wide. A ratio of mean diameter 202 to depth 200 may range from about 1.0:0.5 to about 0.5:1.0. The average spacing 204 between the features 104 may be at least about 0.5 mm to allow sufficient surface area (e.g., a web 208 remaining on the textured surface 102 defined between edges of adjacent features 104) for good adhesion of a resist mask discussed below utilized to form the features 104.

FIG. 3 is partial sectional view of the a feature 104 of the processing chamber component 100 of FIG. 2 illustrating one embodiment of a resist mask 300 disposed on the web 208 of the textured surface 102. The resist mask 300 may be patterned to form openings 302 through which the features 104 are mechanically and/or chemically formed in the component 100. In one embodiment, the shape of the openings 302 may be transferred to the features 104 by wet or dry etching the processing chamber component 100 through the openings 302 of the resist mask 300. In this manner, a transferred pattern of discrete features 104 may be formed in a predefined pattern. The resist mask 300 may be applied on the processing chamber component 100 as a layer of liquid or gel material which is later patterned; or as a sheet of preformed resist.

The resist mask 300 may be patterned using lithography or other suitable techniques to form the openings 302. In one embodiment, a layer of resist material may be patterned on the surface 102 prior to texturing such that portions of the resist material become brittle. When the layer of resist material is etched, the brittle portions of the layer of resist material fracture and break away to define the openings 302 through which the features 104 are formed by continued etching of the now exposed surface 102. For example, if the chamber component 100 comprises aluminum, the chamber component 100 may be dipped in a solution of $FeCl_3$ and $CuCl_2$ to etch the surface 102. In another example, if the chamber component 100 comprises stainless steel, the chamber component 100 may be chemically etched by etchants, such as $FeCl_3$, HCl, NaCl, and the like. For example, $FeCl_3$ (at approximately 38 Baume) may be pressure sprayed onto the surface 102. The $FeCl_3$ may be sprayed at a pressure of between about 20 psi and about 60 psi, such as about 40 psi. The spraying process may proceed under conditions having a temperature between about 75° C. and about 125° C., such as about 100° C.

The portions of the layer of resist material remaining on the surface 102 during etching prevent removal of material from the processing chamber component 100, thereby forming the web 208. In other embodiments, the portions of the layer of resist material which are undeveloped may be removed by a suitable technique, such as power washing, to form the openings 302 in the resist mask 300.

In another embodiment, the layer of resist material utilized as the resist mask 300 is in the form of a sheet of resist which may be patterned before or after application to the surface 102 of the processing chamber component 100. For example, a sheet of resist 310 may include a resist layer 312 disposed on a backing 314. The sheet of resist 310 may include a pressure sensitive adhesive 316 for securing the sheet of resist 310 to the processing chamber component 100. The sheet of resist 310 may be patterned prior to or after coupling to the processing chamber component 100. In one embodiment, an art pattern may be applied to the sheet of resist 300 which is a photoresist, and UV light may be exposed to the resist 300 through the art pattern. A chemical etching process may be performed to remove the surface 102 not protected by the resist 300 to form features 104, and the remaining resist 300 may be stripped, washed, dry etched away or the like. This process advantageously allows the resist 300 to adhere to the surface 102 to form uniform features 104.

Figure 4:
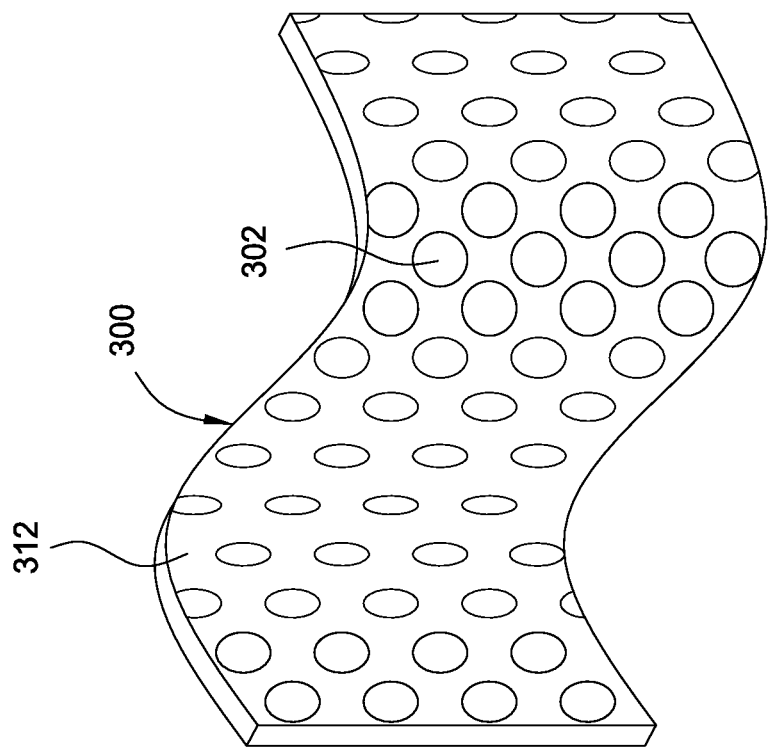
FIG. 4 is a partial plan view of one embodiment of a resist mask.

In yet another embodiment, the resist layer 312 (as additionally seen in FIG. 4 without the backing 314 with the openings 302 formed therein prior to attachment to component 100) is separated from the other portions of the sheet of resist 310 prior to coupling to the processing chamber component 100. Since the separated resist layer 312 is highly flexible, the resist layer 312 may be more conformally applied to surfaces of the processing chamber component 100 having complex or highly contoured surface more easily than the entire sheet of resist 310, thereby preventing wrinkling of the mask layer 300 and allowing shapes of the features 104 to be more precisely formed through the openings 302. The openings 302 in the resist layer 312 without the backing 314 may be patterned prior to or after coupling to the processing chamber component 100.

Figure 5:
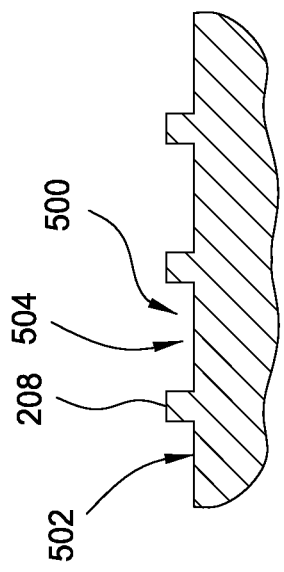
FIG. 5 is partial sectional view of another embodiment of a textured surface of a processing chamber component.
Figure 6:
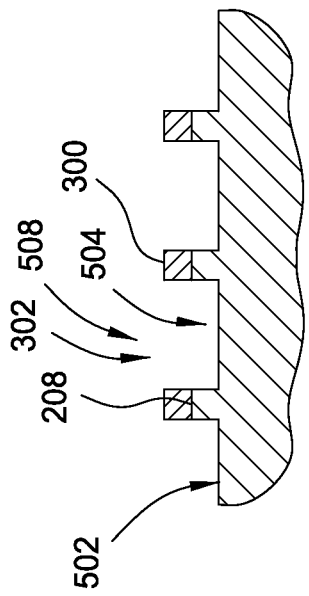
FIG. 6 is partial sectional view of the textured surface of the processing chamber component of FIG. 5 having a resist mask disposed thereon.

FIGS. 5 and 6 are partial sectional views of another embodiment of a macro textured surface 502 of a processing chamber component 500. Features 504 are formed in the processing chamber component 500 substantially as described above, except that the web 208 formed below a resist mask 300 between adjacent features 504 may be substantially smaller than the feature 504, such that the predominant structures present on the textured surface 502 are the raised web 208, as opposed to the recessed features 504, such as shown in FIG. 2.

The macro textured surfaces 102, 502 may be optionally micro textured prior to the application or after the removal of the resist mask 300. Micro texturing is applied to the surface contour of the features 104, 504, and may be formed mechanically by bead blasting both the feature 104, 504 and the web 208 of the chamber components 100, 500. In one embodiment, textured surfaces 102, 502 described herein, may be bead blasted to a surface finish of about 100 to about 300 $R_A$ (μin). Micro texturing may optionally be accomplished through non-mechanical methods, such as acid etching, plasma treatment or other suitable procedure that may produces a suitable surface finish.

Figure 9:
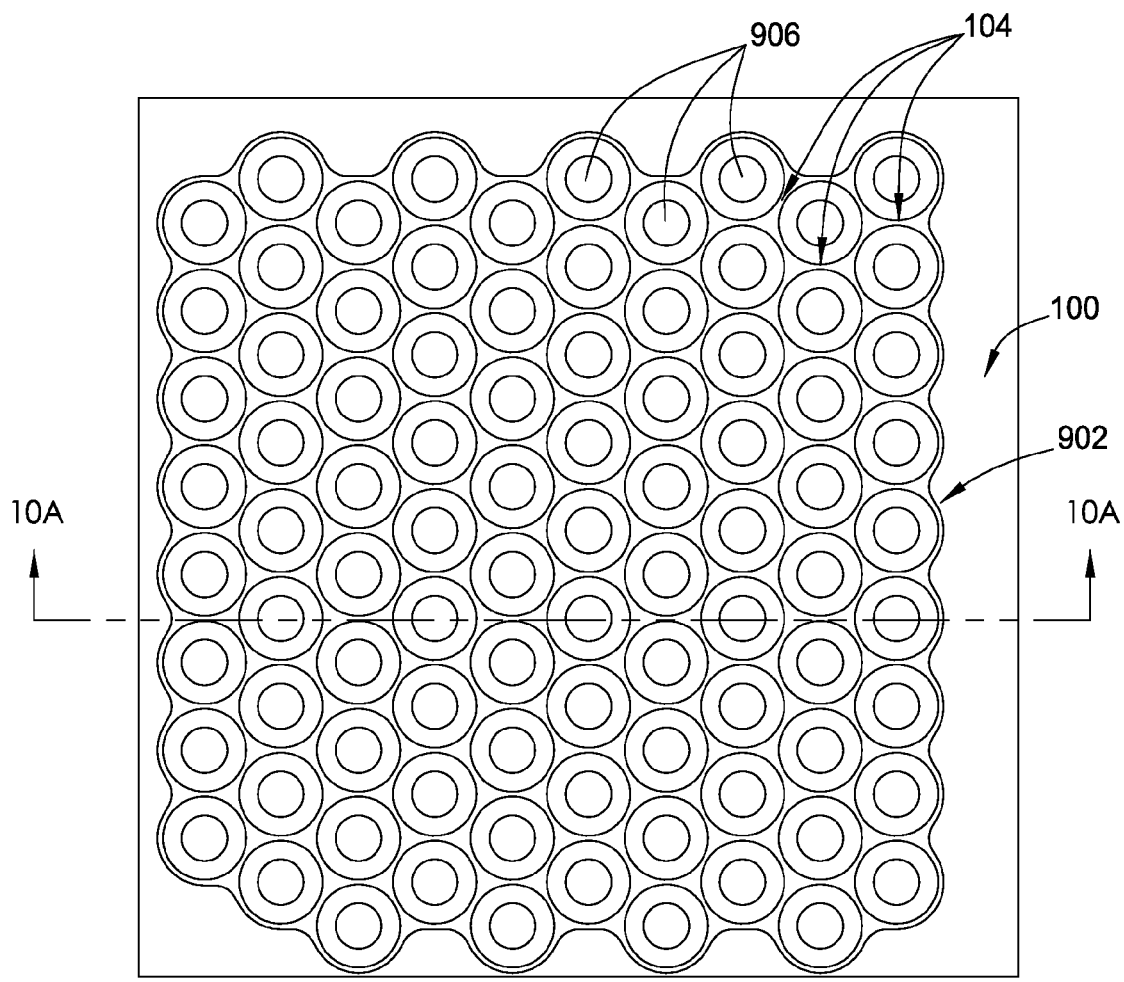
FIG. 9 is a top plan view of a textured surface of a processing chamber component of another embodiment.

FIG. 9 is a partial sectional view of another embodiment of a macro textured surface 902 of a processing chamber component 900. Engineered features 104 forming the macro textured surface 902 may be formed in a surface of the processing chamber component 900 substantially as described above, except that structures 904 defined between the features 104 may have a rounded edge 908, as better seen in FIG. 10A. The structures 904 may be in the form of pillars or mounds of material bounded by the features 104 formed by the material removed during the creation of the textured surface. A recess 906 may be formed in the structures 904 which will be explained in greater detail with regard to FIGS. 10A-10B. The pillars may extend from the processing chamber component 900 and may have any suitable geometric profile, such as cylindrical, polygonal, oval, or other suitable shape. The pillars extending from the processing chamber component 900 may be uniform in shape, size and distribution, or may vary in one or more of shape, size and distribution across the textured surface. The pillars may be discreet and unconnected to neighboring pillars, or two or more pillars may be connected by a web of material.

Figure 10A:
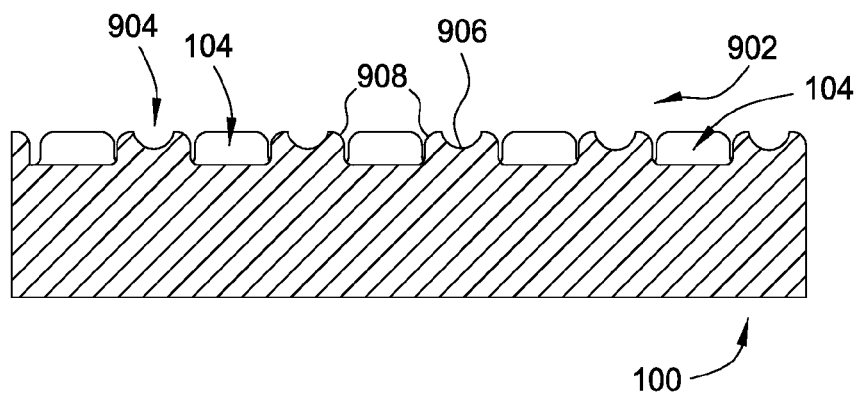
FIGS. 10A-10B are cross-sectional views of the textured surface of the processing chamber component of FIG. 9 taken through section line 10A-10A according to various embodiments.
Figure 10B:
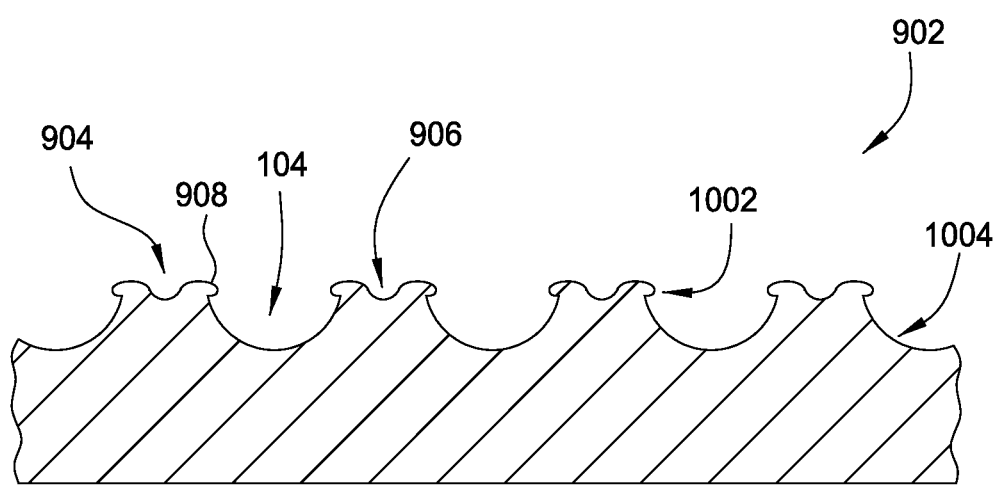

FIGS. 10A-10B are cross-sectional views of the textured surface of the processing chamber component of FIG. 9 taken through section line 10A-10A according to various embodiments. In the embodiment depicted in FIG. 10A, the recess 906 may be formed in the structures 904 at a position in the center of the structures 904. The recess 906, such as a dimple, may have a half-circular cross section. The feature 104 may extend further into the component 100 than the recess 906. As previously mentioned, the structures 904 may have substantially rounded edges 908 adjacent the features 104.

FIG. 10B is a cross-sectional view of the textured surface of the processing chamber component of FIG. 9 also taken through section line 10A-10A according to another embodiment. Here, the features 104 may have a curvilinear appearance when viewed in cross-section. A surface 1004 of the feature 104 may abut the rounded edge 908 to form an overhang 1002. As such, the overhang 1002 may be a portion of the structure 904 which extends laterally outward over a portion of the feature 104. Similar to the embodiments described with regard to FIG. 10A, the recesses 906 may be formed in the structures 904.

The surface 1004 of the recesses 906 may be substantially concave shaped and may advantageously enhance the adhesion of a film to the surface 1004. It is believed that the concave shaped surface may exert a compressive force on a film deposited within the recesses 906. As a result, the adhesion of the film to the surface 1004 may be increased which may reduce particle generation within a processing chamber.

In one embodiment, the rounded edges 908 and surface 1004 may be formed advantageously during the chemical etching process described above, as described below with reference to FIGS. 13A-13E, or other suitable process, without the need for subsequent bead blasting. Because certain materials and thin chamber components cannot withstand the heat and stress of bead blasting, chemical etching allows the features 104, rounded edges 908 of the structures 904, and surface 1004, and various other chamber components 100 having a thickness of less than 0.1 inches to be processed according to embodiments described herein. In the embodiment depicted in FIGS. 9 and 10A-10B, the structures 904 defined by the features 104 are arranged in close-packed circular pattern, such that a line of sight surface between the features is not present to enhance film retention characteristics of the textured surface 902. For example, as illustrated in FIG. 10A, the structures 904 formed one staggered behind the other block the line of sight across the macro textured surface 902, thereby enhancing film adhesion.

Figure 11:
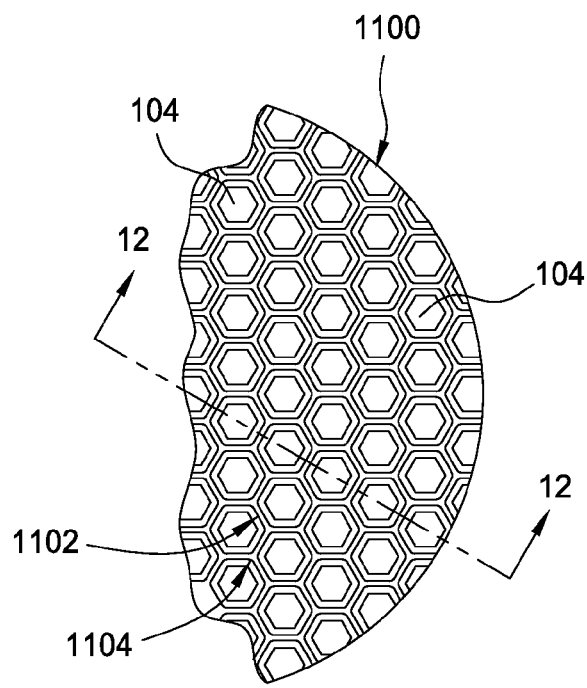
FIG. 11 is a partial plan view a textured surface of a processing chamber component of one embodiment.

FIG. 11 is a partial plan view of a macro textured surface 1100 of a processing chamber component 100 according to another embodiment. Features 104 are formed in the surface of the chamber component 100 and separated by interconnecting walls 1104 such that no line of sight surface is defined on the wall across the textured surface 1100. In one embodiment, the interconnecting walls 1104 may form a plurality of cylindrical, oval or polygonal shapes, for example, the walls 1104 may be arranged to define a honeycomb pattern. A top surface 1106 (See FIG. 12) of the walls 1004 may be rounded to reduce stresses on both the textured surface 1100 and films deposited thereon. Additionally, outer edges 1006 of the walls 1004 defined by the features 104 may be advantageously rounded during formation of the engineered features 104. In the chemical etching process, as described above, the photoresist is not completely developed at the edges of the art pattern, so that the photoresist erodes away during the chemical or mechanical formation of the features 104 to create rounded edges 1006 as seen in FIG. 12 so that subsequent blasting is not required for edge rounding.

Figure 12:
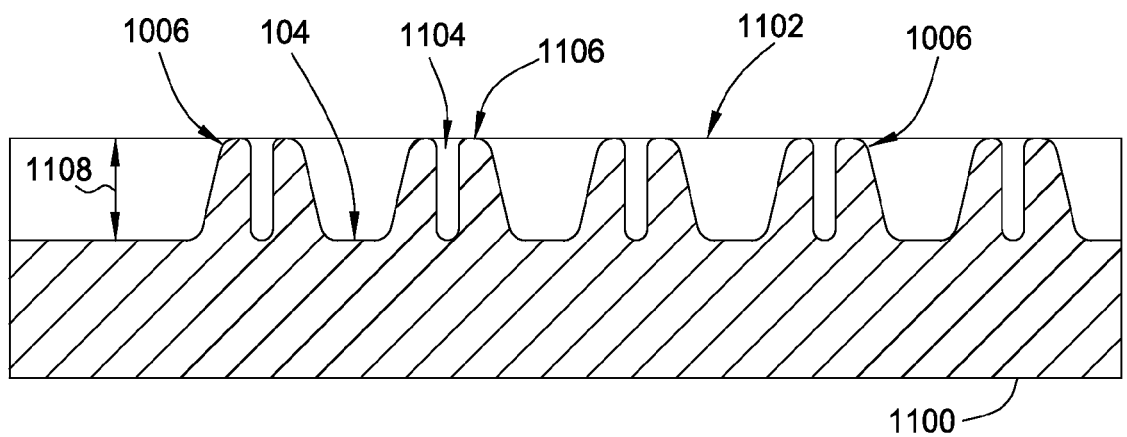
FIG. 12 is a partial cross-sectional view of the textured surface of the processing chamber component of FIG. 11 taken through section line 12-12.

FIG. 12 is a partial cross-sectional view of the textured surface of the processing chamber component of FIG. 11 taken through section line 12-12. The features 104 formed in the surface of the chamber component 100 and separated by interconnecting walls 1004 may have any suitable geometric profile, such as cylindrical, polygonal, oval, or other suitable shape. The features 104 formed in the processing chamber component 100 may be uniform in shape, size and distribution, or may vary in one or more of shape, size and distribution across the macro textured surface 1100. A trench 1102 may be formed between adjacent walls 1104 which may be defined by the features 104. The trench 1102 may comprise a substantially concave cross-section depending upon a depth 1108 with which the trench 1102 extends into the chamber component 100. In one example, the depth 1108 of the trench 1102 may be substantially equal to a depth of the features 104.

FIGS. 13A-13E are partial cross-sectional views of a processing chamber component 100 illustrating different stages of a fabrication sequence utilized to form one embodiment of a textured surface on the processing chamber component 100 using engineered features 104. Advantageously, the process illustrated in FIGS. 13A-3E allows for the structures defined by the engineered features 104 to be formed with an overhang 1002 having rounded edges 908, thereby forming a more stress free textured surface that more readily retains deposited films.

Figure 13A:
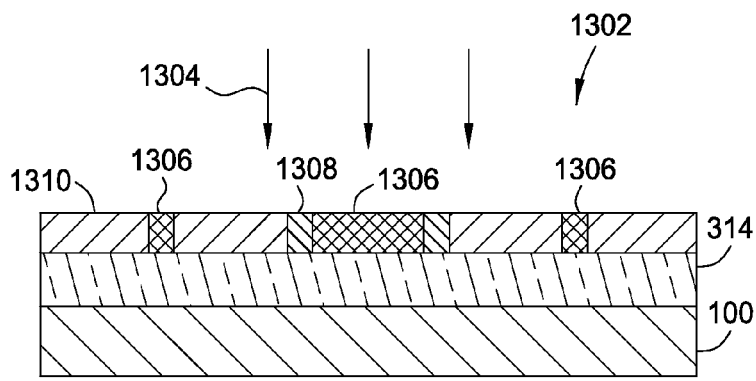
FIGS. 13A-13E are partial cross-sectional views of a processing chamber component illustrating different stages of a fabrication sequence utilized to form one embodiment of a textured surface on the processing chamber component.

Referring first to FIG. 13A, the processing chamber component 100 may be coated with a photoresist layer 314. Artwork 1302 may be disposed over or placed on top of the photoresist layer 314. The artwork 1302 may include one or more types of regions, for example: a plurality of transparent regions 1306 through which energy 1304 may pass to expose the underlying photoresist layer 314; opaque regions 1308; and non-transparent regions 1310 which substantially block energy 1304 from exposing the underlying photoresist layer 314. The opaque regions 1308 may have a grayscale selected to allow a portion of the energy 1304 to partially expose the underlying photoresist layer 314.

Figure 13B:
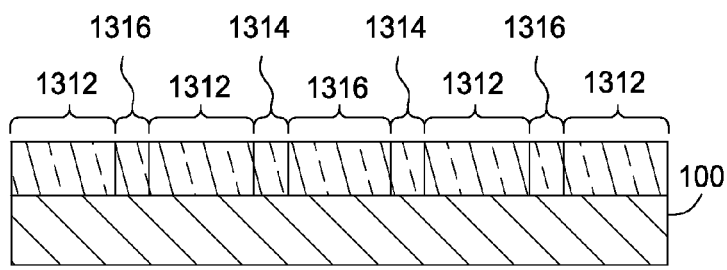
Figure 13C:
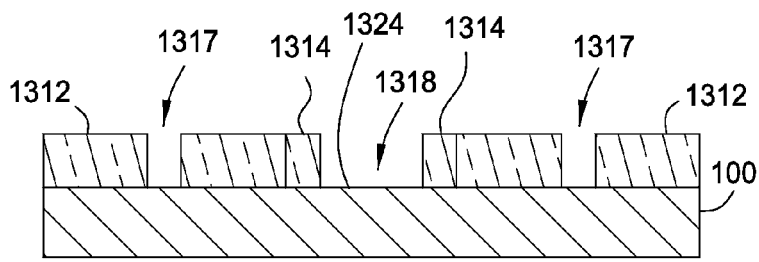

The underlying photoresist layer 314 may be exposed through the artwork 1302 to form a developed region 1312, a partially developed region 1314, and a non-developed region 1316, as shown in FIG. 13B. The non-developed region 1316 may be removed, for example by bead blasting, etching, or power washing to form openings 1318, 1317 exposing an upper surface 1324 of the chamber component 100 through the patterned photoresist layer 314, as illustrated in FIG. 13C.

Figure 13D:
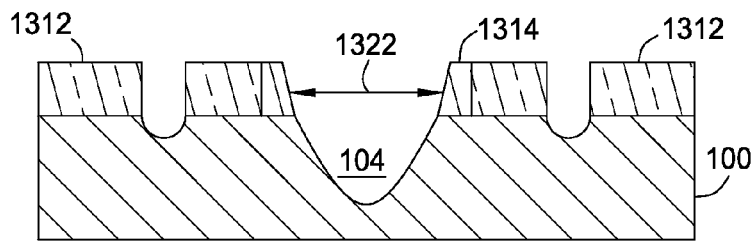
Figure 13E:
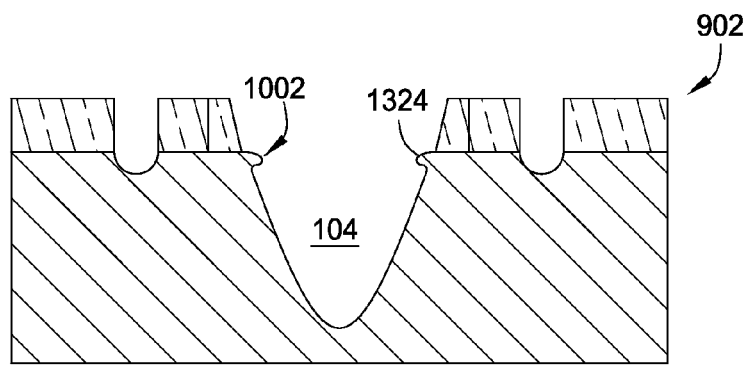

Referring now to FIGS. 13D-13E, the feature 104 may be formed by removing material from the upper surface 1324 of the processing chamber component 100. As discussed above, the material may be removed by bead blasting, etch or power washing. The partially developed region 1314, being softer or more brittle (depending on the photoresist utilized), may be quickly eroded during the material removal process, thus increasing the aperture (width or diameter 1322) of the opening 1318 while the feature 104 is formed. In certain embodiments, such as forming the openings 1317, the partially developed region 1314 may not be used. Near the completion of the material removal process, the partially developed region 1314 may be eroded to the point that the underlying upper surface 1324 of the processing chamber component 100 becomes exposed such that the overhang 1002 bounding the feature 104 has edges 908 which become rounded. The overhang 1002 advantageously reduces the stress on both the textured surface 1100 and films deposited thereon.

If an etching process is utilized in the above method, an anisotropic etchant or isotropic etchant may be utilized for form a desired feature 104. For example, the features of FIG. 10A may be formed by utilizing an anisotropic etchant to form sidewalls which are substantially perpendicular to a bottom of the feature 104. In this example, the surfaces of the trench may be substantially linear. In another example, the features of FIG. 10B may be formed by utilizing an isotropic etchant to form the surfaces of the feature 104 which may be substantially curvilinear. Moreover, the overhang 1002 may result from utilizing an isotropic etchant.

It is noted that in any of the embodiments described above, the engineered features forming the textured surface 102, 502, 902, 1100 may optionally be micro textured a surface finish of about 100 to about 300 $R_A$ (μin). Micro texturing may applied by bead blasting acid etching, plasma treatment or other suitable procedure that may produces a suitable surface finish.

Figure 14:
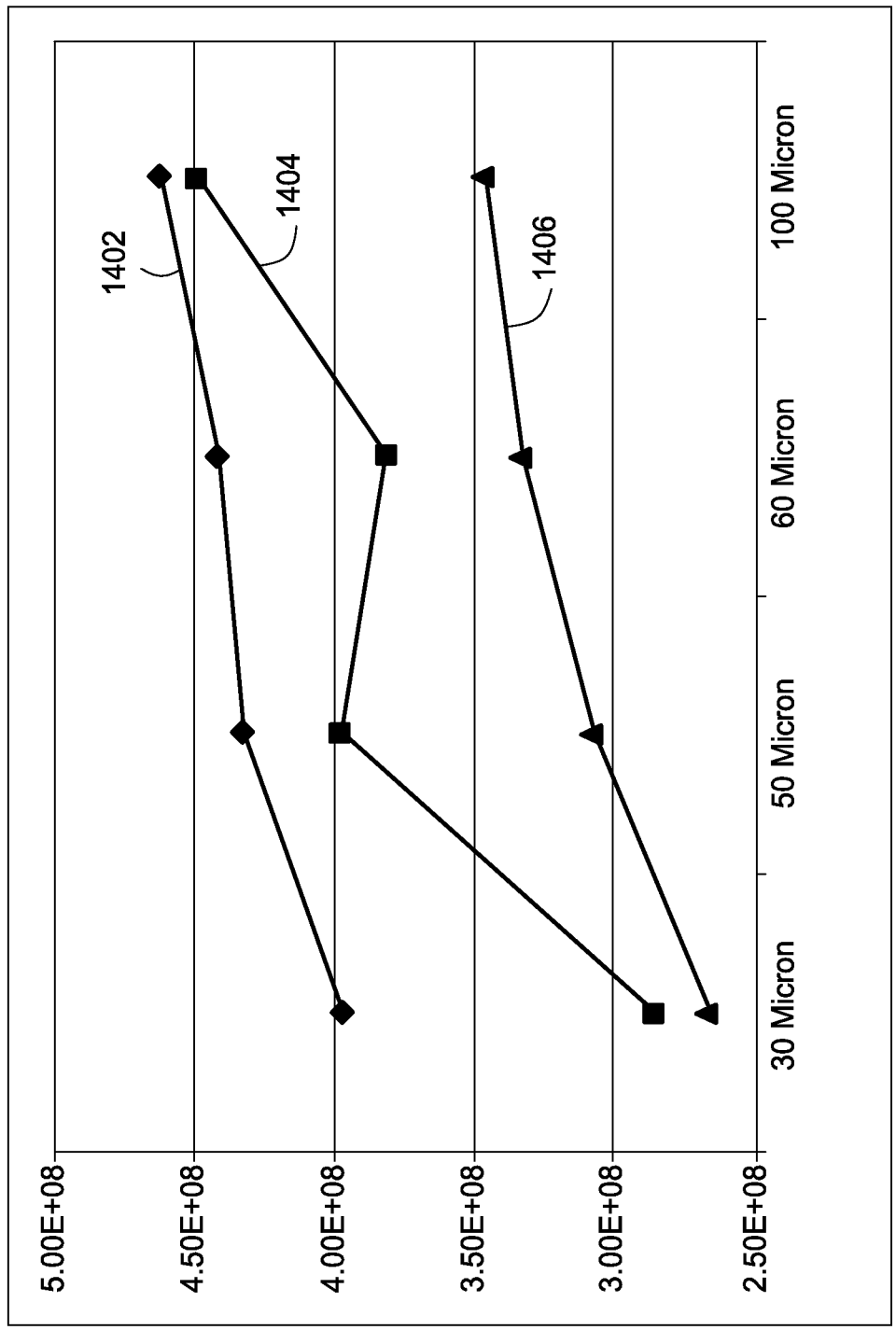
FIG. 14 depicts a graph showing the relationship between film stress and feature shape.

FIG. 14 depicts a graph showing the relationship between film stress and feature 104 shape. Plots 1402 and 1404 depict macro structures having substantially linear surfaces with features formed therein. Plot 1406 depicts macro structures having substantially concave curvilinear surfaces and the resulting film stress. As may be seen, the film stress in plots 1402 and 1404 is substantially greater than the film stress of plot 1406. The greater degree of film stress may result in decreased film retention and an increase in particle creation. The concave surfaces provide about a 25% reduction in film stress which increased film adhesion to macro features of a textured surface. Accordingly, structures having concave features and concave recesses formed therein may advantageously provide enhanced film adhesion and a reduction in particle creation while extending process kit life.

Figure 7:
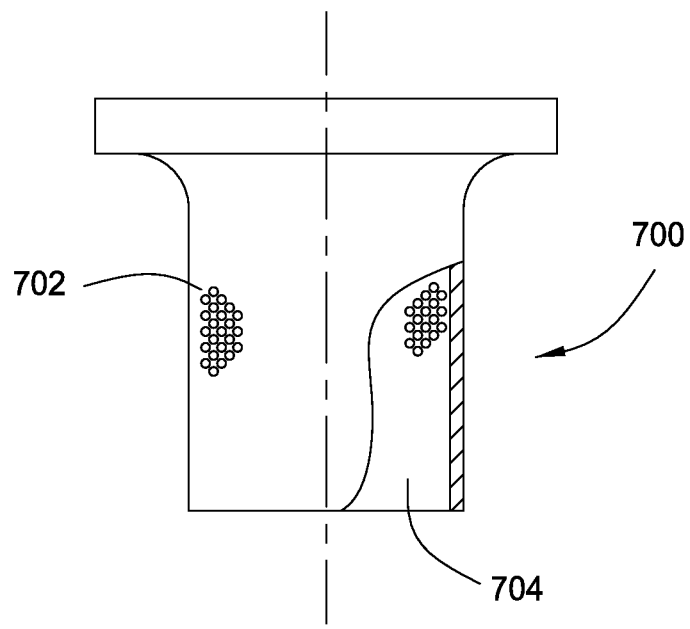
FIGS. 7-8 are exemplary embodiments of processing chamber components having one or more textured surfaces.
Figure 8:
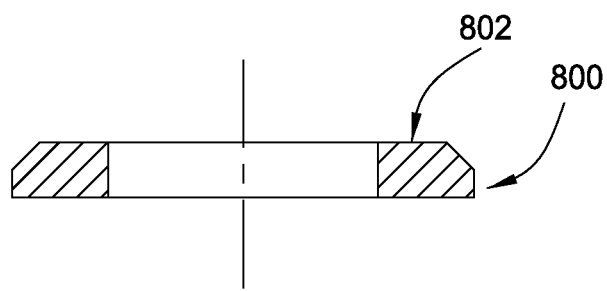

Referring back to FIGS. 7 and 8, FIG. 7 depicts a PVD chamber shield according to certain embodiments. The shield 700 includes at least one surface textured as described above. For example, at least one of an outer diameter surface 702 or an inner diameter surface 704 (shown in cut-away) of the shield 700 is macro textured to form engineered features as discussed above, and the engineered features may be optionally micro textured. Referring now to FIG. 8, a process kit ring 800 is provided according to certain embodiments. The ring 800 includes at least one macro textured surface formed using engineered features as described in the embodiments above, wherein the engineered features may be optionally micro textured. For example, at least an upper disk shaped surface 802 of the ring 800 may be both macro and micro textured. The ring 800 may be a deposition ring, a clamp ring, a cover ring, a focus ring, an edge ring or other ring utilized in a semiconductor processing chamber. The semiconductor chamber components discussed above with reference to FIGS. 7 and 8 are by way of illustration, and other semiconductor chamber components, such as but not limited to chamber bodies, pedestals, liners, collimators, shadow frames, and cover rings among others, may be macro and micro textured for form a textured semiconductor chamber component having extended service life and low particle generation characteristics.

While the foregoing is directed to embodiments of the present invention, other and further embodiments of the invention may be devised without departing from the basic scope thereof, and the scope thereof is determined by the claims that follow.

The invention claimed is:

1. An article having a surface patterned to enhance retention of deposited films, comprising:
    a processing chamber component having a macro textured surface formed from one or more engineered features arranged to prevent formation of a line of sight surface across the macro textured surface, wherein the macro textured surface comprises one or more structures, the one or more structures comprising:
    a top surface; and
    an overhang, having a rounded edge, located along a sidewall of the one or more structures, wherein the overhang originates from the top surface of the one or more structures and
    a recess is formed within a center area of the top surface of each of the one or more structures located radially inward from the overhang.

2. The article of claim 1, wherein the engineered features are arranged in a predefined pattern.

3. The article of claim 1, wherein the top surface of the one or more structures is rounded.

4. The article of claim 3, wherein a depth of the engineered features is greater than a depth of the recess.

5. The article of claim 3, wherein a surface of the recess is substantially concave.

6. The article of claim 5, wherein the concave surface of the recess is adapted to exert a compressive force on a film deposited on the surface of the recess.

7. The article of claim 1, wherein the engineered features are bounded by walls forming a hexagonal honeycomb pattern.

8. The article of claim 1, wherein the engineered features are closely packed.

9. The article of claim 1, wherein the engineered features form discreet pillars.

10. The article of claim 7, wherein a trench is formed between the walls forming the hexagonal honeycomb pattern.

11. The article of claim 10, wherein a surface of the trench is substantially concave.

12. The article of claim 1, wherein the engineered features forming the textured surface have at least one of a uniform shape, size and distribution across the textured surface.

13. An article having a surface patterned to enhance retention of deposited films, comprising:
    a processing chamber component having a macro textured surface formed from engineered features arranged in a predefined pattern that prevents formation of a line of sight surface across the textured surface, the engineered features being arranged in a predefined pattern, wherein the engineered features comprise surfaces having a substantially concave shape and one or more structures defining the macro textured surface, the structures comprising:
    a rounded overhang located along a sidewall and extending radially outward from a top surface of the one or more structures, wherein
    a substantially concave recess formed within a center area of the top surface of the one or more structures and located radially inward from the rounded overhang.

14. The article of claim 13, wherein the engineered features are bounded by walls forming a hexagonal honeycomb pattern.

15. The article of claim 13, wherein the engineered features are closely packed.

16. The article of claim 13, wherein the engineered features form discreet pillars.

17. The article of claim 16, wherein the engineered features are bounded by structures forming mounds having a substantially concave recess formed therein.

\* \* \* \* \*